United States Patent [19]

Cadien et al.

[11] Patent Number: 5,516,346
[45] Date of Patent: May 14, 1996

[54] SLURRIES FOR CHEMICAL MECHANICAL POLISHING

[75] Inventors: Kenneth C. Cadien; Daniel A. Feller, both of Portland, Oreg.

[73] Assignee: Intel Corporation, Santa Clara, Calif.

[21] Appl. No.: 242,538

[22] Filed: May 13, 1994

Related U.S. Application Data

[62] Division of Ser. No. 146,923, Nov. 3, 1993, Pat. No. 5,340,370.

[51] Int. Cl.$^6$ .................... C23F 1/44; B44C 1/22
[52] U.S. Cl. .................. 51/308; 106/3; 252/79.4; 216/89; 216/108; 216/109
[58] Field of Search .............. 51/308, 293; 106/3; 252/79.4, 79.1; 156/636, 637

[56] References Cited

U.S. PATENT DOCUMENTS

| | | | |
|---|---|---|---|
| 3,937,806 | 2/1976 | Cooley | 424/52 |
| 4,117,109 | 9/1978 | Stookey | 424/57 |
| 4,122,163 | 10/1978 | Muhler et al. | 424/52 |
| 4,725,375 | 2/1988 | Fujii et al. | 252/794 |
| 5,084,071 | 1/1992 | Nanadic et al. | 51/308 |
| 5,137,544 | 8/1992 | Medellin | 51/308 |
| 5,145,668 | 9/1992 | Chow et al. | 424/52 |
| 5,209,816 | 5/1993 | Yu et al. | 156/636 |
| 5,228,886 | 7/1993 | Zipperian | 51/308 |
| 5,270,031 | 12/1993 | Lim et al. | 424/49 |
| 5,340,370 | 8/1994 | Cadien et al. | 51/308 |

OTHER PUBLICATIONS

Kaufman, et al., "Chemical–Mechanical Polishing for Fabricating Patterned W Metal Features as Chip Interconnects", *J. Electrochem. Soc.*, vol. 138, No. 11, Nov., 1991.

*Primary Examiner*—Deborah Jones
*Attorney, Agent, or Firm*—Blakely, Sokoloff, Taylor & Zafman

[57] ABSTRACT

Novel slurries for the chemical mechanical polishing of thin films used in integrated circuit manufacturing. A tungsten slurry of the present invention comprises an oxidizing agent, such as potassium ferricyanide, an abrasive such as silica, and has a pH between two and four. The tungsten slurry of the present invention can be used in a chemical mechanical planarization process to polish back a blanket deposited tungsten film to form plugs or vias. The tungsten slurry can also be used to polish copper, tungsten silicide, and titanium nitride. A second slurry, which is a 9:1 dilution of the tungsten slurry is ideal for chemical mechanical polishing of titanium nitride films. A third slurry of the present invention comprises a fluoride salt, an abrasive such as silica and has a pH≦8. The third slurry can be used to polish titanium films.

14 Claims, 7 Drawing Sheets

SLURRIES FOR CHEMICAL MECHANICAL POLISHING

This is a divisional of application Ser. No. 08/146,923, filed Nov. 3, 1993, now U.S. Pat. No. 5,340,370.

BACKGROUND OF THE INVENTION

1. Field of the Invention

The present invention relates to the field of semiconductor integrated circuit manufacturing, and more specifically, to improved slurries for the chemical mechanical polishing (CMP) of thin films used in semiconductor integrated circuit manufacturing.

2. Description of Relevant Art

Today, integrated circuits are made up of literally millions of active devices formed in or on a silicon substrate or well. The active devices which are initially isolated from one another are later connected together to form functional circuits and components. The devices are interconnected together through the use of well-known multilevel interconnections. A cross-sectional illustration of a typical multilevel interconnection structure 100 is shown in FIG. 1. Interconnection structures normally have a first layer of metallization, an interconnection layer 102 (typically aluminum alloys with up to 3% copper), a second level of metallization 104, and sometimes a third or even fourth level of metallization. Interlevel dielectrics 106 (ILDs), such as doped and undoped silicon dioxide ($SiO_2$), are used to electrically isolate the different levels of metallization in silicon substrate or well 108. The electrical connections between different interconnection levels are made through the use of metallized vias 110 formed in ILD 106. In a similar manner, metal contacts 112 are used to form electrical connections between interconnection levels and devices formed in well 108. The metal vias 110 and contacts 112, hereinafter being collectively referred to as "vias" or "plugs", are generally filled with tungsten 114 and generally employ an adhesion layer 116 such as TiN. Adhesion layer 116 acts as an adhesion layer for the tungsten metal layer 114 which is known to adhere poorly to $SiO_2$. At the contact level, the adhesion layer acts as a diffusion barrier to prevent W and Si from reacting.

In one process which has presently gained wide interest, metallized vias or contacts are formed by a blanket tungsten deposition and a chemical mechanical polish (CMP) process. In a typical process, via holes 202 are etched through an ILD 204 to interconnection lines or a semiconductor substrate 206 formed below. Next, a thin adhesion layer 208, such as TiN, is generally formed over ILD 204 and into via hole 202, as shown in FIG. 2b. Next, a conformal tungsten film 210 is blanket deposited over the adhesion layer and into the via 202. The deposition is continued until the via hole 202 is completely filled with tungsten. Next, the metal films formed on the top surface of ILD 204 are removed by chemical mechanical polishing, thereby forming metal vias or plugs 220.

In a typical chemical mechanical polishing process, as shown in FIG. 2c, the substrate or wafer 200 is placed face-down on a polishing pad 212 which is fixedly attached to a rotatable table 214. In this way, the thin film to be polished (i.e., tungsten film 210) is placed in direct contact with pad 212. A carrier 216 is used to apply a downward pressure $F_1$ against the backside of substrate 200. During the polishing process, pad 212 and table 214 are rotated while a downward force is placed on substrate 200 by carrier 216. An abrasive and chemically reactive solution, commonly referred to as "slurry" 222 is deposited onto pad 212 during polishing. The slurry initiates the polishing process by chemically reacting with the film being polished. The polishing process is facilitated by the rotational movement of pad 212 relative to wafer 200 as slurry is provided to the wafer/pad interface. Polishing is continued in this manner until all of the film on the insulator is removed.

Slurry composition is an important factor in providing a manufacturable chemical mechanical polishing process. Several different tungsten slurries have been described in literature. One slurry described in "Chemical Mechanical Polishing for Fabricating Patterned W Metal Features as Chip Interconnects" [F. B. Kaufman, et al., *Journal of the Electrochemical Society*, Vol. 138, No. 11, November 1991], describes a slurry comprising potassium ferricyanide having a pH adjusted to greater than 5. It has been found that slurries with a pH greater than five form plugs 220 which are recessed below the insulating layer, as shown in FIG. 2d. Such recessing causes a non-planar via layer to be formed which impairs the ability to print high resolution lines during subsequent photolithography steps and can cause the formation of voids or open circuits in the metal interconnections formed above. Additionally, the recessing of plug 220 increases when overpolishing is used to ensure complete removal of the tungsten film across the surface of a wafer. The recessing is further compounded when soft polishing pads are used during polishing (soft polishing pads are thought to help provide high and uniform polishing rates). As such, high pH slurries have been found inadequate to manufacturably polish tungsten layers in an integrated circuit.

On the other hand, slurries with low pH's (i.e., pH's< 2) have been found to provide high removal rates, good uniformity, and small recessing of the plugs. Unfortunately, however, slurries with pH's less than two are considered hazardous materials and therefore require special handling procedures which substantially increase manufacturing costs. Additionally, low pH slurries readily react and cause corrosion of the polishing apparatus. As such, low pH slurries have been found inadequate to manufacturably chemically mechanically polish films in an integrated circuit process.

As such, what is desired are slurries for chemical mechanical polishing of thin films used in integrated circuit manufacturing which do not form recessed plugs and which are not hazardous or corrosive.

SUMMARY OF THE INVENTION

A novel slurry for chemical mechanical polishing (CMP) of films used in integrated circuit manufacturing is described. The first slurry of the present invention comprises approximately 0.1 molar potassium ferricyanide, approximately 5% silica by weight, and has a pH adjusted to a value less than four and greater than two, with approximately 3.4–3.6 being preferred. Concentrated acetic acid can be used to adjust the pH of the slurry to the desired level. Additionally, the first slurry can further comprise potassium acetate to help buffer the slurry and lubricate the polishing process. The first slurry can be used in a CMP process where a tungsten, tungsten silicide, copper, or titanium nitride film in an integrated circuit is planarized, or polished back into plugs or interconnections. A second slurry can be made by diluting the first slurry at a ratio of approximately 9:1 with deionized water (i.e., 9 parts deionized water to 1 part tungsten slurry). The second slurry can be used for polishing titanium nitride films. A third slurry comprising approximately 0.5 molar potassium fluoride, approximately 0.5% silica by weight, and having a pH of approximately 5.2 can be used for polishing titanium films.

An object of the present invention is to provide slurries which can be used in a CMP process to form plugs or interconnects which are not recessed below the ILD layer.

Another object of the present invention is to provide slurries which are nonhazardous and noncorrosive.

Yet another object of the present invention is to provide slurries whose effluent can be recycled and treated by conventional methods.

Still yet another object of the present invention is to provide slurries which are manufacturably cost effective.

Still yet another objective of the present invention is to provide slurries which have a high and uniform polish rate across the surface of a wafer and from wafer to wafer.

Still yet another objective of the present invention is to provide slurries which allow overpolishing in a CMP process without significantly recessing formed vias or interconnections.

BRIEF DESCRIPTION OF THE DRAWINGS

FIG. 2b is a cross-sectional illustration showing the formation of an adhesion layer and a tungsten layer on the substrate of FIG. 2a.

FIG. 3b is a cross-sectional illustration showing the formation of an adhesion layers and a tungsten layer on the substrate of FIG. 3a.

FIG. 4b is a cross-sectional illustration showing the formation of a barrier layer and a copper layer on the substrate of FIG. 4a.

DETAILED DESCRIPTION OF THE PRESENT INVENTION

Figure 1:
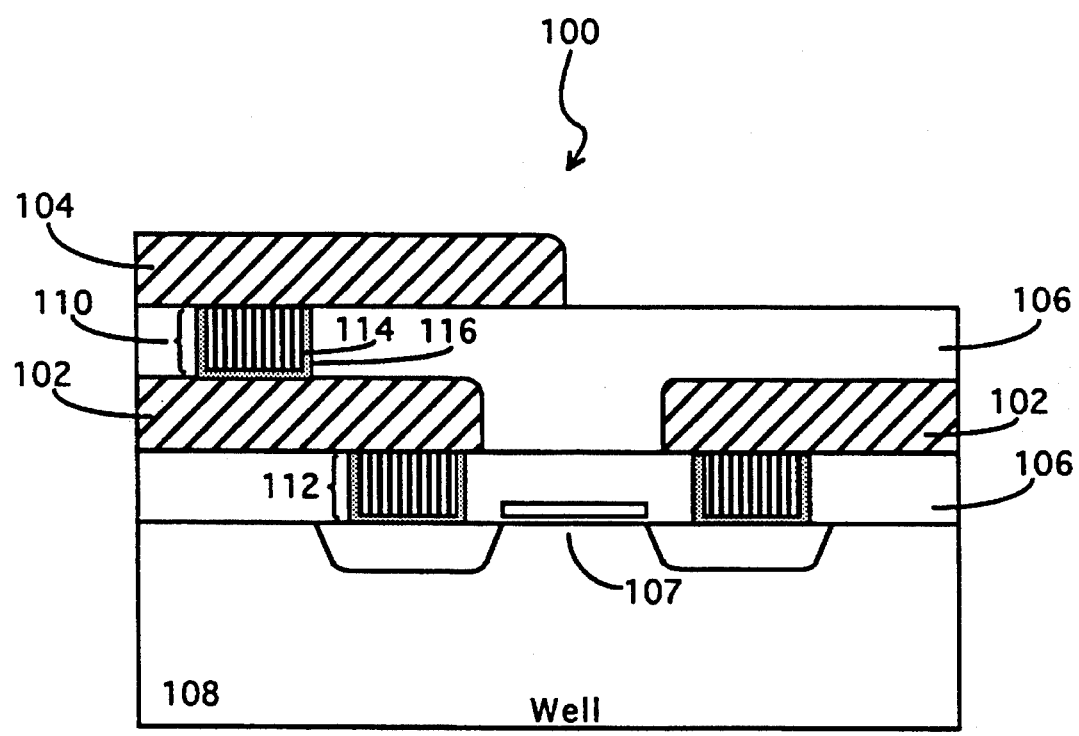
FIG. 1 is a cross-sectional illustration showing a portion of a standard multilevel integrated circuit.
Figure 2A:
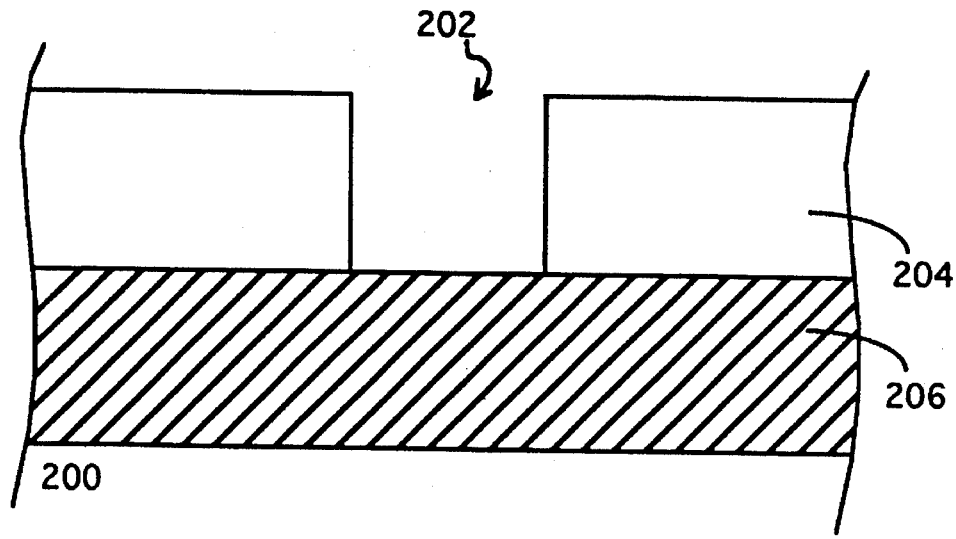
FIG. 2a is a cross-sectional illustration showing the formation of a via hole through an insulating layer formed on a conductive layer of a semiconductor substrate.
Figure 2B:
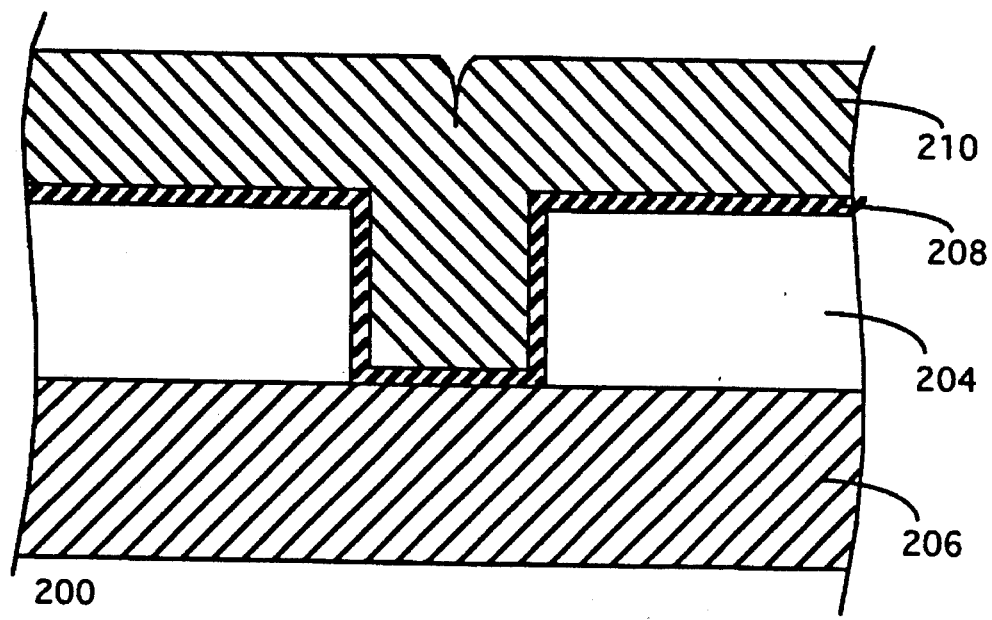
Figure 2C:
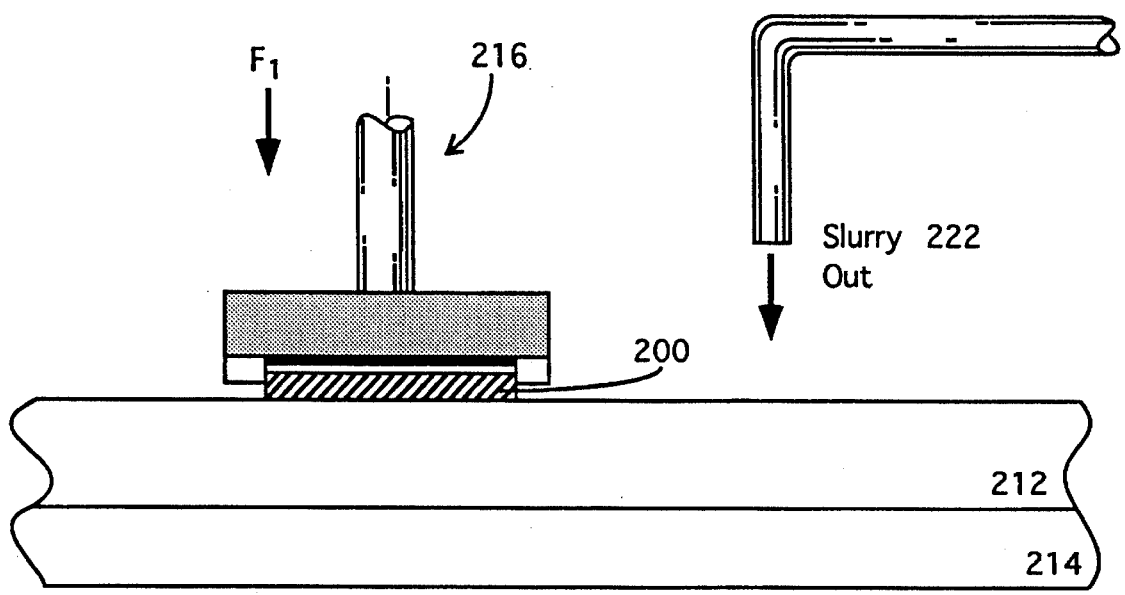
FIG. 2c is a cross-sectional illustration of a chemical mechanical polishing apparatus used to polish the films formed on the substrate of FIG. 2b.
Figure 2D:
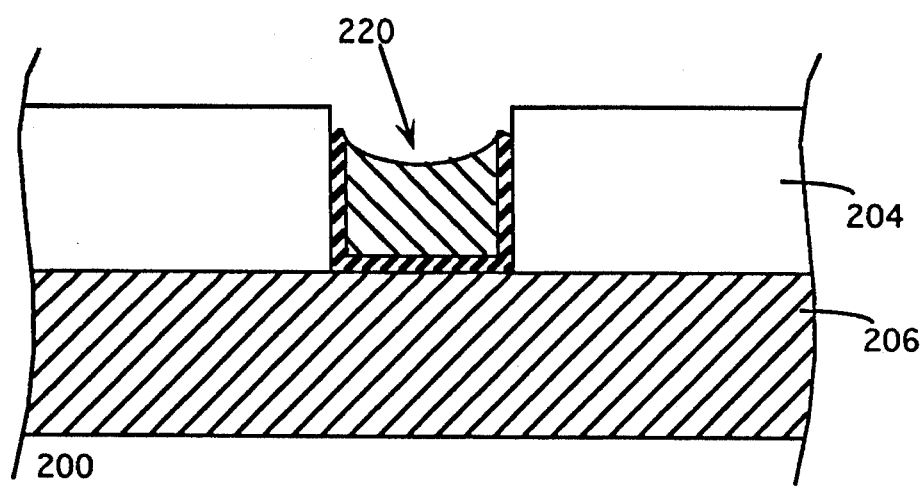
FIG. 2d is a cross-sectional illustration showing the formation of a plug which has been recessed below the interlayer dielectric.

Novel slurries for chemical mechanical polishing of thin films used in high density integrated circuits are described. In the following description numerous specific details are set forth, such as specific machinery materials, thicknesses, etc., in order to provide a thorough understanding of the present invention. It will be obvious, however, to one skilled in the art that the present invention may be practiced without these specific details. In other instances, other well-known semiconductor processes and machinery have not been described in particular detail in order to avoid unnecessarily obscuring the present invention.

The present invention describes novel slurries for the chemical mechanical polishing (CMP) of thin films used in a semiconductor integrated circuit. The novel slurries and CMP processes of the present invention are preferably used to form a via connection or plug between conductive layers of a semiconductor device. The teachings of the present invention, however, can be applied to other processes in the manufacture of semiconductor integrated circuits including, but not limited to, the formation of interconnections and the planarization of various layers. In fact, the teachings of the present invention can be applied to CMP processes used in areas other than semiconductor processing.

In the fabrication of a contact or via connection between two conductive layers of an integrated circuit, a semiconductor substrate or wafer 300 is provided. Substrate 300 at this point has a conductive layer 301 as the top most layer. The conductive layer 301 can be any one of a variety of conductive materials used in semiconductor circuit manufacturing including but not limited to a metal layer, a semiconductor such as silicon, a doped semiconductor, a polysilicon layer, or a metal silicide layer. An interlayer dielectric (ILD) 302 is formed over conductive layer 301. Interlayer dielectric 302 is a thin film insulator which is generally an undoped silicon dioxide ($SiO_2$) formed by plasma enhanced CVD of TEOS between interconnection layers. A phosphosilicate (PSG) or borophosphosilicate (BPSG) film is generally used between polysilicon and metal layers. It is to be appreciated that other insulating layers, such as silicon nitride, or multilayer composite dielectrics, including such things as spin on glass, may also be used. The function of interlayer dielectric 302 is to electrically isolate conductive layer 301 from a subsequently formed conductive layer. Interlayer dielectric 302 can be formed by techniques well-known in the art.

First, an opening or via hole 304 is formed in interlayer dielectric 302. A photoresist layer is formed over ILD 302 which is then masked, exposed, and developed with techniques well-known in the art to define the location for via hole 304. The insulating layer 302 is then anisotropically etched with techniques well-known in the art to form via hole 304. Via hole 304 is etched until conductive layer 301 is reached. A via hole with substantially vertical side walls and a large aspect ratio (aspect ratio= via depth/via width) is desired. Such a via hole is compatible with the high packing density required for future ultra large scale integrated (ULSI) circuits.

Figure 3A:
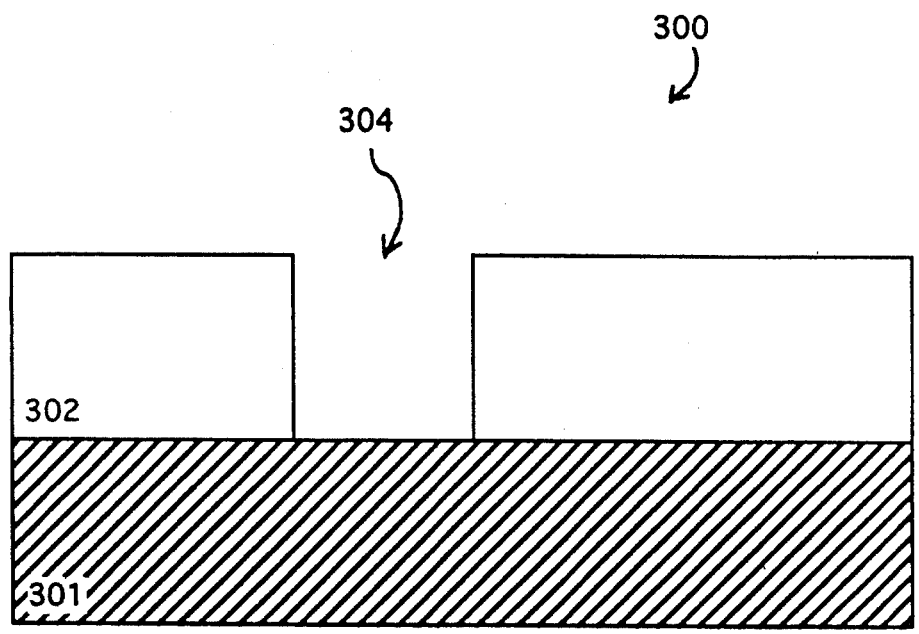
FIG. 3a is a cross-sectional illustration of a portion of a substrate showing the formation of a via hole through an interlayer dielectric formed on a conductive layer of a semiconductor substrate.
Figure 3B:
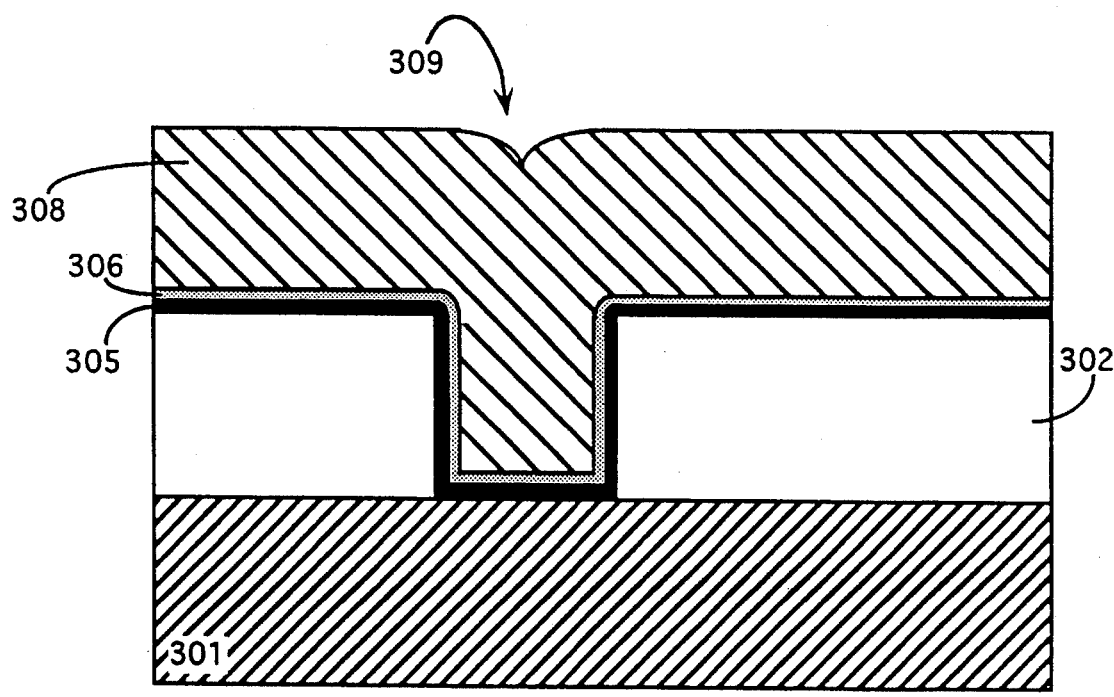

Next, as shown in FIG. 3b, an adhesion layer or adhesions layers (if used) are blanket deposited over ILD 302. In the preferred method of the present invention, an approximately 200 Å titanium (Ti) contact layer 305 is blanket deposited over the top surface of ILD 302, on the sides of ILD 302 in via hole 304 and on conductive layer 301 in via hole 304. The function of titanium contact layer 305 is to decrease the contact resistance of the fabricated plug in order to improve electrical performance. Titanium layer 305 also acts as a polish stop for tungsten and/or TiN polish steps described below. Titanium contact layer 305 is formed to a thickness of approximately 200 Å and can be formed by well-known means, such as sputtering from a titanium target. Next, a titanium nitride (TiN) layer 306, of a thickness of approximately 600 Å, is blanket deposited over titanium layer 305. Titanium nitride layer 306 can be formed by any one of a plurality of well-known techniques, including but not limited to, reactive sputtering from a titanium target in a nitrogen atmosphere and chemical vapor deposition (CVD). Titanium nitride layer 306 provides an adhesion layer and a diffusion barrier for a subsequently deposited tungsten layer which is known to have poor adhesion to insulators like $SiO_2$, and high reactivity with metals such as aluminum and titanium. Efforts should be made to form titanium layer 305 and titanium nitride layer 306 as conformally as possible so that high aspect ratio vias can be reliably formed. It is to be appreciated that other adhesion layers, such as tungsten silicide formed by chemical vapor deposition, may be used if desired.

Next, as also shown in FIG. 3b, a tungsten (W) layer 308 is blanket deposited over TiN layer 306. The deposition completely fills via hole 304 with tungsten. The deposition forms a thick tungsten layer on the top surface of ILD 302. A slight dimple 309 may result in the top portion of tungsten layer 308 over via hole 304. Tungsten layer 308 is formed to a thickness between 4000–5000 Å for an 4500 Å diameter plug. Tungsten layer 308 can be formed by CVD using hydrogen ($H_2$) reduction of tungsten hexafluoride ($WF_6$) wherein the ratio of $H_2$ to $WF_6$ is approximately 7:1. An Applied Materials Precision 5000 deposition system can be used for depositing tungsten layer 308. The tungsten layer adheres well to underlying TiN adhesion layer 306 and the titanium layer 305 forms a good ohmic contact with conductor layer 301 below.

Figure 3C:
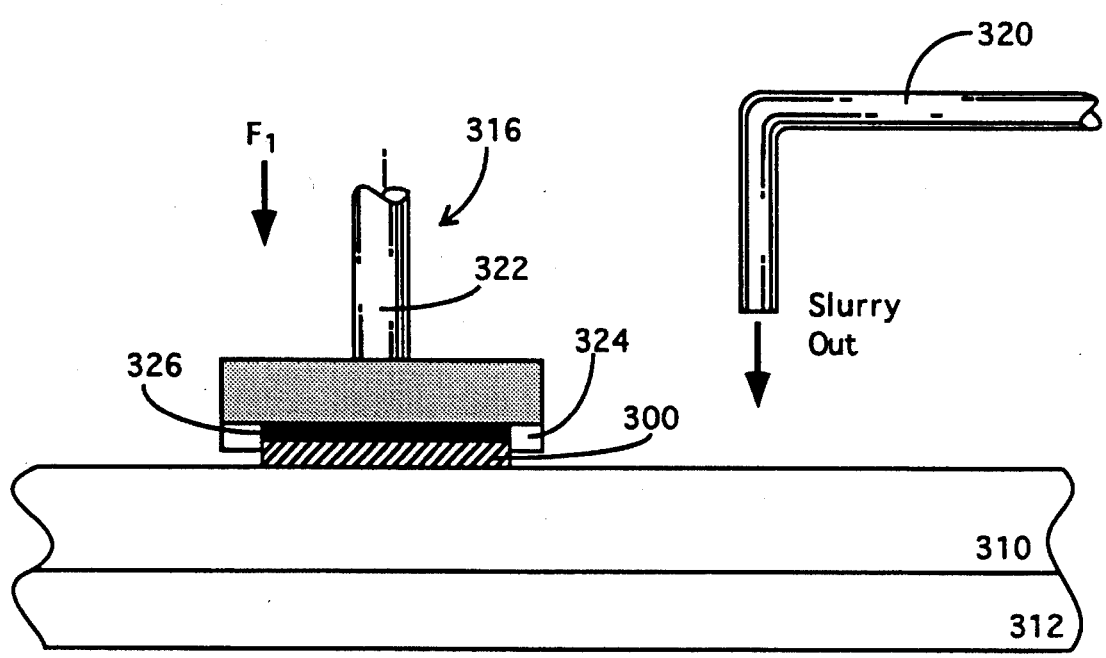
FIG. 3c is a cross-sectional illustration showing a chemical mechanical polishing apparatus which can be used to chemical mechanical polish the films formed on the substrate of FIG. 3b.
Figure 3D:
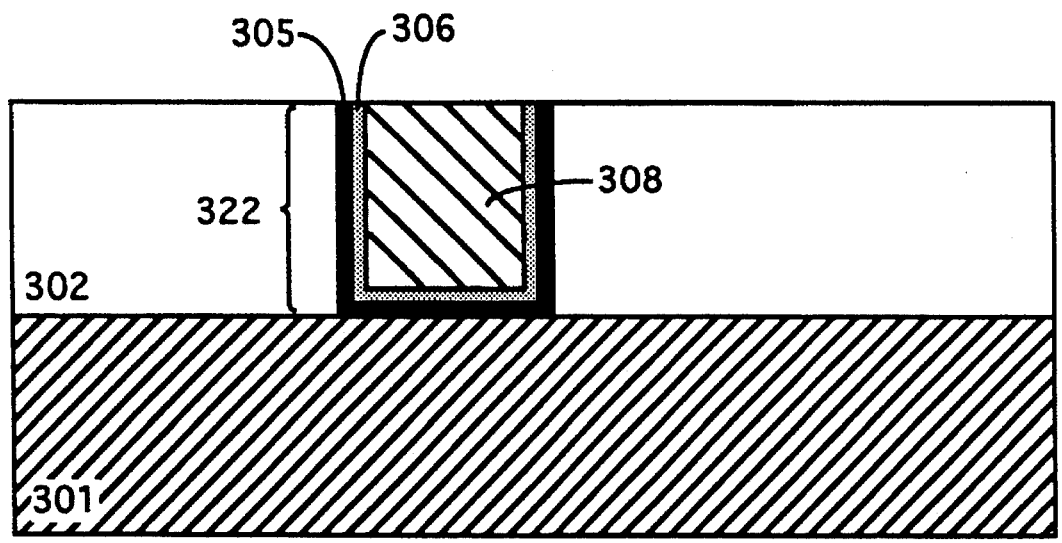
FIG. 3d is a cross sectional illustration showing the formation of a tungsten plug after chemical mechanically polishing the substrate of FIG. 3b.

Next, as shown in FIG. 3c, tungsten layer 308, titanium nitride layer 306, and titanium layer 305 are chemical mechanically polished back to form metallized plugs. In a typical CMP process, substrate 300 is placed face down on a polishing pad 310 attached to a rotatable table 312. In this way the thin film to be polished (i.e. tungsten film 308) is placed in direct contact with polishing pad 310. A carrier 316 is used to forcibly press substrate 300 down against polishing pad 310 during polishing. A slurry is deposited onto polishing pad 310 from a nozzle 320 during polishing. Slurry chemically passivates or oxidizes the thin film being polished and then abrasively removes or polishes off the passivated surface. The removal of the thin film is facilitated by the chemically reactive slurry as pad 310 and substrate 300 are rotated relative to one another under a polishing pressure $F_1$ applied by carrier 316. Polishing is continued in this manner until the desired planarization is achieved or the desired amount of film is removed.

Polishing pad 310 can be formed of a variety of different materials. For example, polishing pad 310 can be a hard pad such as the IC-60 pad manufactured by Rodel Corporation. Additionally, polishing pad 310 can be a relatively soft pad such as the Polytech Supreme pad also manufactured by Rodel Corp. A soft polishing pad is thought to provide improved polish removal rates and improved uniformity. What is important, however, is for polishing pad 310 to adequately and uniformly deliver slurry across the entire wafer/pad interface. A plurality of performed grooves can be added to pad 310 to help transport slurry about the wafer/pad interface. Additionally, slurry need not be simply deposited onto pad 310 from a nozzle 320, as shown in FIG. 3c, but rather can be pumped through the polishing pad directly to the wafer pad interface as described in copending U.S. patent application Ser. No. 08/103,412 filed Aug. 6, 1993 and assigned to the present assignee. Such a technique allows for a fast and manufacturable transition between different slurry types. Additionally, polishing pad 310 need not necessarily rotate to facilitate abrasive polishing, but rather may move in other directions, such as in an orbital direction with a radius less than the substrate radius, as described in U.S. patent application Ser. No. 08/103,412 filed Aug. 6, 1993 and assigned to the present assignee.

A carrier similar to carrier 316 can be used to forcibly press and rotate wafer 300 against polishing pad 310 during polishing. A shaft 322 is used to apply a downward force $F_1$ (between 2–12 psi) and to rotate substrate 300 during polishing. An ordinary retaining ring 324 can be used to prevent substrate 300 from slipping laterally during polishing. An insert pad 326 is preferably used to cushion substrate 300 from carrier 316. Wet surface tension or vacuum pressure can be used to hold wafer 300 in place. It is to be appreciated, however, that other carriers such as curved carriers or the improved carriers described in co-pending U.S. patent application Ser. No. 08/103,918 filed Aug. 6, 1993 and assigned to the present assignee can be used without departing from the scope of the present invention.

The key to obtaining good and manufacturable CMP results in the present invention are the novel slurries utilized in the chemical mechanical polishing (CMP) process. A novel tungsten slurry is used to polish back tungsten film 308. The novel tungsten slurry of the present invention comprises an oxidizing agent capable of oxidizing tungsten, an abrasive for physically removing the oxidized tungsten, and has a pH between two and four. The pH is low enough to prevent plug recessing but yet is high enough so that the slurry is nonhazardous. A slurry having a pH between 3.4 to 3.6 is preferred in the present invention because it provides a good balance between plug recessing and handling hazards and costs.

Oxidizing agents including, but not limited to, potassium ferricyanide, potassium dichromate, potassium iodate, potassium bromate, and vanadium trioxide, can be used in the tungsten slurry. Potassium ferricyanide ($K_3Fe(CN)_6$) is the preferred oxidizing agent in the present invention because it does not readily precipitate out of solution, cause corrosion, nor is it classified as a hazardous material. Additionally, potassium ferricyanide has been found to be a good oxidant for materials such as tungsten, tungsten silicide, copper, and titanium nitride films, all used in integrated circuit manufacturing. The slurry has a concentration of oxidant high enough to sufficiently oxidize the entire surface area of the film being polished, yet low enough so that it can be dissolved in the slurry (i.e., a concentration less than its solid solubility). A slurry comprising between 0.01 to 0.3 molar potassium ferricyanide has been found to provide sufficient results. A slurry comprising approximately 0.1 molar potassium ferricyanide (i.e. 32.9 grams per liter of potassium ferricyanide) is preferred because it provides a sufficient amount of oxidizing agent (approximately ten times more than stoichiometrically necessary), and yet is a concentration small enough to keep slurry costs down. It is also to be appreciated that the tungsten slurry of the present invention can contain up to approximately 3.0 molar potassium ferricyanide (i.e., the solid solubility of potassium ferricyanide) if desired. Such a large amount of potassium ferricyanide, however, will significantly increase slurry costs and will increase the polish rate to an uncontrollable level.

An abrasive, such as silica, alumina, or ceria, is provided in the slurry to physically or mechanically strip the passivated surface of the metal being polished. Silica is the preferred abrasive in the present invention because it can be used without scratching the surface of the material being polished. The tungsten slurry of the present invention utilizes a colloidal silica comprising between 1–25% by weight silica, with approximately 5% by weight being preferred. This amount of silica provides an optimum balance between polish removal rate and good selectivity to interlayer dielectrics used in integrated circuit manufacturing. Additionally, this amount of abrasive is sufficient to abrasively "buff" or polish the film, but yet is low enough to keep slurry costs down. The preferred colloidal silica is manufactured by Cabot, Inc. and sold under the tradename Semi-Sperse™-25. (Semi-Sperse™-25 comprises approximately 25% by weight silica, a small amount of KOH and deionized water.) An alternative colloidal silica is Cab-O-Sperse® also manufactured by Cabot, Inc. (Cab-O-Sperse® comprises approximately 15% weight percent silica and the remainder deionized water.)

It is recommended to provide a small amount (between 0.05 to 0.005 molar) potassium acetate ($CH_3COOK$) in the tungsten slurry. Potassium acetate buffers the chemistry (i.e., stabilizes the pH). Additionally, it is suspected that potassium acetate helps to lubricate the polish, thereby making the CMP process of the present invention more manufacturable. Potassium acetate can be added directly to the slurry or may be introduced through a reaction of slurry components. For example, potassium acetate can be formed by reaction of potassium from either potassium ferricyanide or potassium hydroxide in the colloidal silica, and acetate from acetic acid used to adjust the pH of the slurry.

The preferred slurry composition for chemical mechanical polishing of tungsten films is a solution comprising approximately 0.1 molar potassium ferricyanide, approximately 5% by weight silica, a small amount of potassium acetate with the remainder deionized water. A small amount of concentrated acetic acid is included to adjust the pH of the tungsten slurry to the desired range of 3.4 to 3.6. The tungsten slurry of the present invention can be formed by diluting Semi-Sperse™-25 colloidal silica with deionized water until it is approximately 10% silica by weight. The diluted Semi-Sperse™-25 colloidal silica is then mixed at a 1:1 ratio with the approximately 0.2 molar potassium ferricyanide. A small amount of acetic acid can then be added to the slurry to adjust the pH to the preferred range of 3.4 to 3.6.

The preferred composition of the novel tungsten slurry of the present invention exhibits many properties and qualities which make the chemical mechanical polishing process of the present invention extremely manufacturable. The slurry exhibits a high tungsten polish removal rate of approximately 1600–2400 Å/min, providing good wafer throughput. Additionally, the polish removal rate is very uniform with less than 10% deviation over three sigma. (It will be understood by those skilled in the art that such things as pad types, polish pressure, rotation rates, etc., effect polish removal rate and polish uniformity.) Additionally, the slurry is much more selective to tungsten than to insulators typically used in semiconductor manufacturing. For example, the slurry has a tungsten/$SiO_2$ selectivity of greater than 25:1 and a tungsten BPSG selectivity of greater than 4:1. In this way overpolishing can be used without significantly attacking insulating layers formed below and causing potential reliability problems. Still further, the tungsten slurry of the present invention can retain its consistency indefinitely, allowing the tungsten slurry to be premixed. It is to be appreciated that prior art slurries tend to degrade and precipitate out active ingredients over time. Additionally, the tungsten slurry chemistry of the present invention allows slurry effluent (waste) to be recycled once or more without treatment. This provides a substantial savings in both slurry consumption costs and effluent disposal costs. Still further, since the slurry of the present invention utilizes noncorrosive potassium ferricyanide as the active ingredient, a clean and an environmentally safe CMP process is provided. Additionally, the waste from the tungsten CMP process can be treated by presently available waste treatment processes. The tungsten slurry of the present invention can also be used to polish other materials used in integrated circuit manufacturing, including but not limited to tungsten silicide, copper and titanium nitride.

The abrasive polishing of tungsten layer 308 is continued in the above-described manner until substantially all of the tungsten layer 308 formed on the titanium nitride layer 305 formed over the top surface of the interlayer dielectric 302 is removed. Next, TiN adhesion layer 306 (if used) is chemically mechanically polished. The TiN adhesion layer can be polished with the tungsten slurry described above. The polish removal rate of TiN with the tungsten slurry, however, is low (~450 Å/min). A low TiN polish rate coupled with a high tungsten polish rate can result in significant plug recessing. It is, therefore, preferred to dilute the tungsten slurry with deionized water at a ratio of 9:1 (i.e. 9 parts deionized water to 1 part tungsten slurry) to form a titanium nitride slurry. By diluting the tungsten slurry the titanium nitride slurry comprises approximately 0.01 molar potassium ferricyanide approximately 0.5% silica by weight and has a pH between 2 and 4. By diluting the tungsten slurry, the TiN polish removal rate increases to approximately 800 Å/min while the tungsten polish rate decreases to less than <1000 Å/min. In this way the TiN adhesion layer is removed at a high enough rate to allow for good wafer throughput. More importantly, however, by decreasing the tungsten polish rate to approximately the same rate as the TiN polish rate, the tungsten plug is not "overpolished" or recessed while polishing the TiN adhesion layer. TiN adhesion layer 306 is polished until all of the TiN formed on titanium layer 305 over the top surface of ILD 302 is removed. Since the tungsten slurry (standard or diluted) does not significantly polish titanium, titanium layer 305 effectively acts as a polish stop for the TiN polish step. This helps to make the CMP process of the present invention very manufacturable.

Next, titanium layer 305 (if used) formed on the top surface of ILD 302 is removed by chemical mechanical polish. In the preferred embodiment of the present invention, a novel titanium slurry is used to facilitate the chemical mechanical polishing of titanium layer 305. The novel titanium slurry of the present invention comprises a fluoride salt, an abrasive, and has a pH≦8. The fluoride salt acts as a complexing agent to complex the titanium film, and the abrasive mechanically strips the complexed titanium surface. The complexing agent preferably is a fluoride salt including, but not limited to, sodium fluoride and potassium fluoride. The slurry should have a fluoride salt concentration high enough to sufficiently complex the entire titanium surface, but yet low enough to keep slurry costs down. The preferred composition of the titanium slurry comprises approximately 0.5 molar potassium fluoride. The abrasive can be any one of a variety of well-known abrasives including, but not limited to, silica, ceria and alumina. The preferred composition of the titanium slurry of the present invention comprises approximately 0.5% silica by weight which provides the slurry with good selectivity to titanium over oxides. In order to increase the polish rate of the titanium slurry the amount of silica in the slurry can be increased to as high as 15% by weight. It is to be appreciated, however, that such a large amount of silica will reduce the titanium/oxide selectivity of the slurry.

The novel titanium slurry of the present invention has a pH ≦ 8, and preferably a pH adjusted to approximately 5.2. The pH of the titanium slurry can be adjusted by adding acetic acid or other well-known acids. The pH of the titanium slurry is known to effect polish removal rates. The titanium slurry exhibits a titanium polish removal rate of approximately 250 Å/min when the pH is approximately 5.2. Additionally, with a pH of 5.2, the titanium slurry polishes titanium nitride at a rate of approximately 40 Å/min and the polish rate of tungsten is undetectable. In this way, titanium layer 305 can be polished without recessing or overpolishing the tungsten plug. Additionally, with the novel titanium slurry, titanium nitride adhesion layer 306 inside the via is not significantly removed during titanium polishing and therefore no "etch-out" of the plug will result. Still further, the titanium slurry is more selective to titanium than to ILDs such as SiO₂ and BPSG. This allows overpolishing to be utilized. It is to be noted that if the titanium slurry and the tungsten slurry are mixed, significant plug recessing may result. As such, it is imperative that one thoroughly rinse the wafer and polishing pad with deionized water prior to polishing titanium film 305. It is further advised to use a separate machine for the Ti polish in order to ensure no residual tungsten slurry is present during the titanium polishing.

At the completion of the polishing process, a filled via hole or tungsten plug 322 is formed. Tungsten plug 322 is substantially planar with the top surface of ILD 302. It is to be stressed that in the present invention tungsten plug 322 is not recessed into ILD 302. In fact, there is very little recessing even when a soft polishing pad is utilized. More importantly, tungsten plug 322 exhibits only approximately 500 Å of recessing when overpolishing by 25%. Overpolishing guarantees that all conductors formed on ILD 302 are completely removed so that no electrical shorts may result. The ability to overpolish without significant recessing of plug 322 makes the present process extremely manufacturable.

Figure 3E:
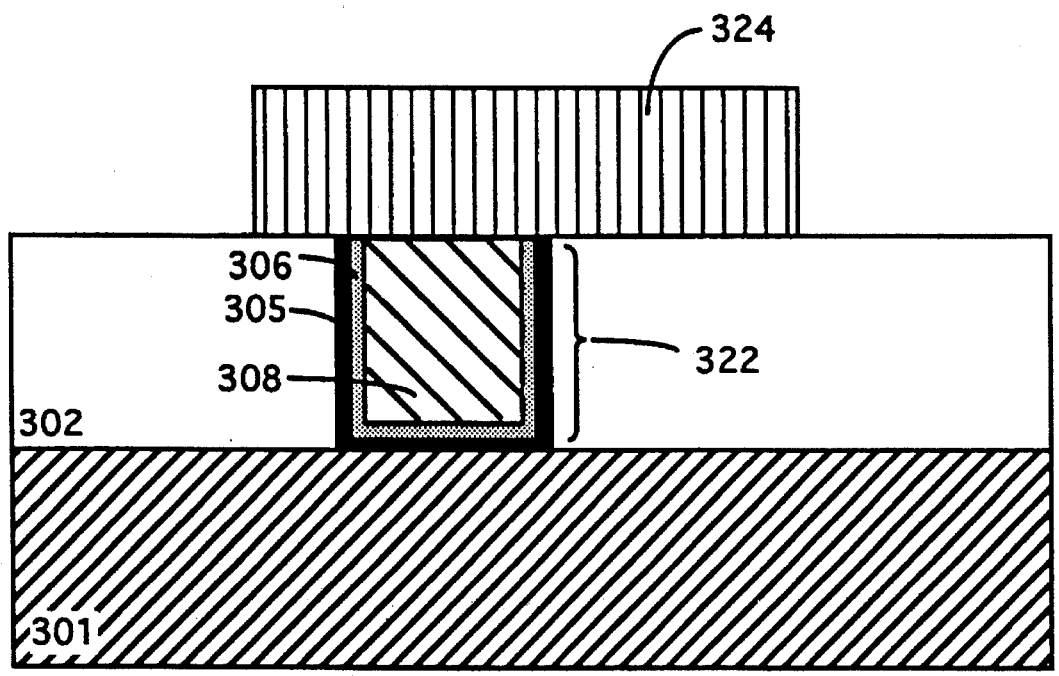
FIG. 3e is a cross-sectional illustration showing the formation of an interconnect line over the planar plug and interlayer dielectric of FIG. 3d.

After completion of the CMP process, as shown in FIG. 3e, an interconnect line 324 is formed on ILD 302 and on tungsten plug 322. Interconnect line 324 can be formed by blanket depositing a conductive layer of, for example, aluminum alloys, tungsten, copper, etc., over ILD 302 and tungsten plug 322. The conductive layer is then covered by a photoresist layer which is then masked, exposed, and developed with techniques well-known in the art, to define the location of interconnect 324. It is to be appreciated that very narrow, high resolution lines can be printed because of the extremely planar plug previously formed by the present invention. The conductive layer is then etched by techniques well-known in the art to form interconnect line 324. It is to be appreciated that interconnect line 324 is substantially planar due to the planar plug formed below. In this way the potential for open circuits which can develop in interconnection lines formed over large step heights, such as recessed plugs, are eliminated. The fabrication of a planar, highly reliable, low resistance, high density electrical connection between two conductive layers of an integrated circuit is now complete.

Figure 4A:
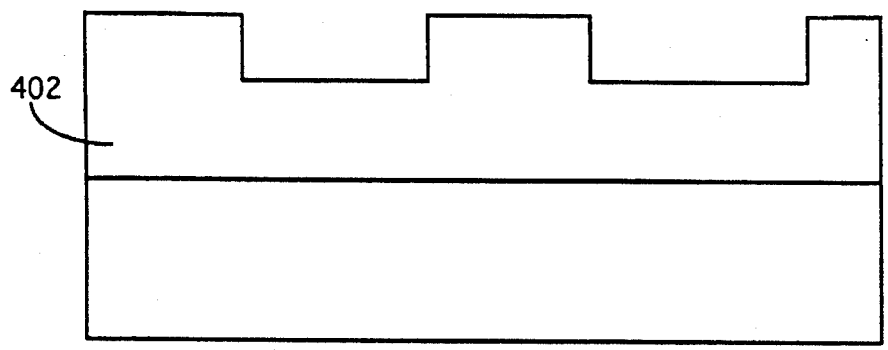
FIG. 4a is a cross-sectional illustration showing the patterning of an interlayer dielectric for the formation of interconnection lines.
Figure 4B:
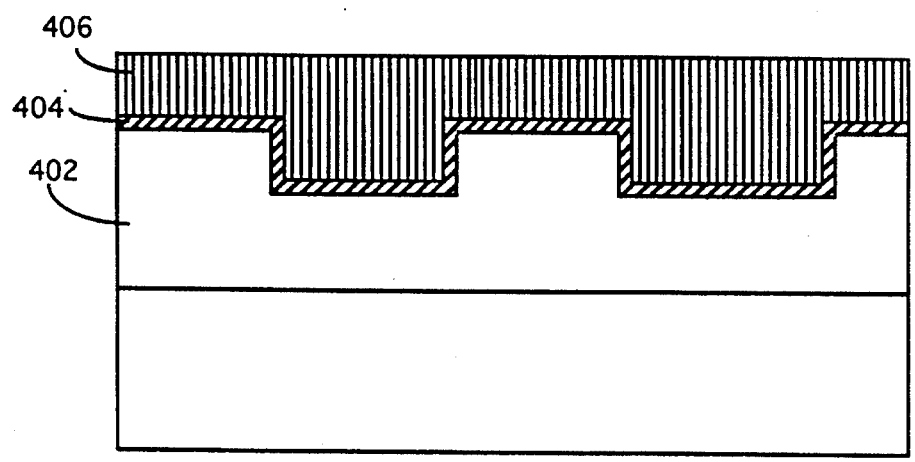
Figure 4C:
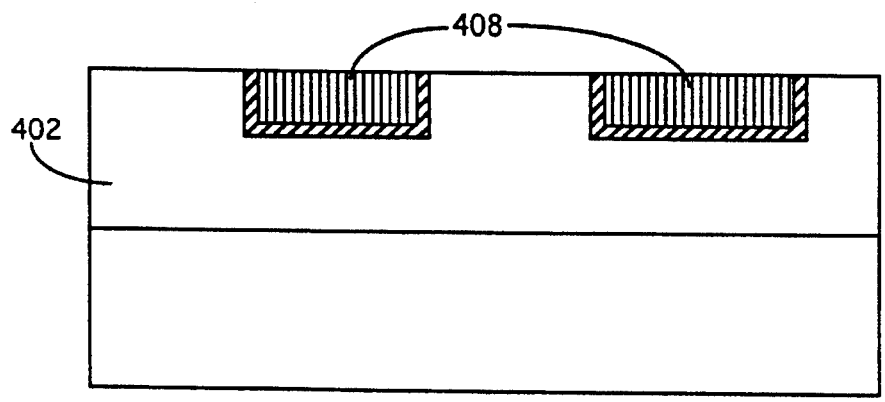
FIG. 4c is a cross-sectional illustration showing the formation of interconnections by chemical mechanical polishing of the substrate of FIG. 4b.

It is to be appreciated that the novel slurries and chemical mechanical polishing processes of the present invention can be used to fill-in grooves other than contacts or vias and can be used to polish metals other than tungsten, tungsten silicide, TiN, and titanium. For example, the tungsten slurry and CMP process of the present invention can be applied to the formation of a copper interconnection layer. In this embodiment, as shown in FIG. 4a, an insulating layer 402 is patterned to provide openings or grooves where interconnection lines are to be formed. An adhesion layer/diffusion barrier, such as TiN, is then formed over the insulating layer and into the grooves covering the sides and the bottom of the groove, as shown in FIG. 4b. A copper layer is then formed with well-known techniques over the adhesion layer and deposited until the grooves are substantially filled. The copper layer and the adhesion layer on the top surface of the insulating layer are then chemically mechanically polished back, as in the plug process, as shown in FIG. 4c. The novel tungsten slurry of the present invention can be used to polish copper. The tungsten slurry has a good copper polish rate of approximately 2000 Å/min and provides good local and global polish uniformity. It is to be appreciated that copper is patterned poorly with standard dry etching techniques. The slurries and chemical mechanical process of the present invention make possible the use of high performance, planar, copper interconnection lines.

It is to be appreciated that the slurries of the present invention have been described in particular detail with respect to preferred processes and structures for forming planar plugs and interconnections. The preferred composition of the slurries are ideally suited for the described processes. The present invention, however, is not intended to be limited to these preferred slurry compositions, via structures and/or CMP processes. One skilled in the art will readily recognize that the actual composition of the slurries can and probably should be optimized depending upon the specific metals, insulators and processes actually used. The scope of the present invention is intended to be defined by the claims which follow.

Thus, novel slurries and CMP processes for chemical mechanical polishing of thin films used in semiconductor integrated circuit manufacturing have been described.

We claim:

1. A slurry for chemical mechanically polishing a titanium film, said slurry comprising:

a fluoride salt in a concentration sufficient to complex said titanium film;

an abrasive; and wherein said slurry has a pH less than eight.

2. The slurry of claim 1 wherein said fluoride salt is potassium fluoride.

3. The slurry of claim 2 wherein said slurry comprises approximately 0.5 molar potassium fluoride.

4. The slurry of claim 1 wherein said abrasive is silica.

5. The slurry of claim 4 wherein said pH is approximately 5.2.

6. The slurry of claim 1 wherein said pH is approximately 5.2.

7. The slurry of claim 1 further comprising acetic acid in a concentration sufficient to maintain said pH.

8. The slurry of claim 1 wherein said slurry comprises less than 15% silica by weight.

9. The slurry of claim 8 wherein said slurry comprises approximately 0.5% silica by weight.

10. A slurry for chemical mechanical polishing a titanium film, said slurry comprising:

potassium fluoride, in an amount sufficient to complex said titanium film;

silica; and wherein said slurry has a pH less than eight.

11. The slurry of claim 10 wherein said slurry comprises approximately 0.5 molar potassium fluoride.

12. The slurry of claim 10 wherein said slurry comprises approximately 0.5% silica by weight.

13. The slurry of claim 10 wherein said slurry further comprises acetic acid in a concentration sufficient to maintain said pH.

14. A slurry for chemical mechanical polishing a titanium film, said slurry comprising:

approximately 0.5 molar potassium fluoride;
approximately 0.5% silica by weight; and
wherein said slurry has a pH of approximately 5.2.

* * * * *